United States Patent
Lee et al.

(10) Patent No.: US 10,451,661 B2
(45) Date of Patent: Oct. 22, 2019

(54) DIGITAL FREQUENCY MEASURING APPARATUS

(71) Applicant: SAMSUNG ELECTRO-MECHANICS CO., LTD., Suwon-si (KR)

(72) Inventors: Jong Woo Lee, Suwon-si (KR); Joo Hyoung Lee, Suwon-si (KR); Je Hyuk Ryu, Suwon-si (KR); Woo Young Choi, Suwon-si (KR); Yong Woon Ji, Suwon-si (KR); Soo Woong Lee, Suwon-si (KR); Byung Joo Hong, Suwon-si (KR); Joo Yul Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 78 days.

(21) Appl. No.: 15/602,653

(22) Filed: May 23, 2017

(65) Prior Publication Data

US 2018/0120364 A1    May 3, 2018

(30) Foreign Application Priority Data

Oct. 28, 2016  (KR) .......................... 10-2016-0141902
Dec. 20, 2016  (KR) .......................... 10-2016-0175036

(51) Int. Cl.
 *G01R 23/02*   (2006.01)
 *H03K 21/40*   (2006.01)
 (Continued)

(52) U.S. Cl.
 CPC ............. *G01R 23/02* (2013.01); *G01R 23/10* (2013.01); *H03K 21/10* (2013.01); *H03K 21/40* (2013.01); *H03H 17/0671* (2013.01)

(58) Field of Classification Search
 CPC ........ G01R 23/02; H03K 21/40; H03K 21/10; H03H 17/0671
 See application file for complete search history.

(56) References Cited

U.S. PATENT DOCUMENTS

2013/0278311 A1    10/2013   Wen
2015/0055803 A1*    2/2015   Qutub ...................... H04R 3/00
                                                         381/111

FOREIGN PATENT DOCUMENTS

GB    2503961 A    1/2014
JP    2013-68626 A    4/2013
(Continued)

OTHER PUBLICATIONS

Lata et al., Design of a Decimator Filter for Novel Sigma-Delta Modulator, Mar.-Apr. 2013, IOSR Journal of VLSI and Signal Processing (IOSR-JVSP), vol. 2, Issue 1, pp. 31-37 (Year: 2013).*
(Continued)

*Primary Examiner* — Toan M Le
(74) *Attorney, Agent, or Firm* — NSIP Law

(57) ABSTRACT

A digital frequency measuring apparatus includes a frequency divider dividing an input frequency signal and providing a divided frequency signal; a period counter counting clock cycles in a period of the divided frequency signal using a clock signal and providing a period count value for each period; and a digital filter amplifying the period count value using an accumulated gain, converting an amplified period count value into a frequency, and providing a first digital output value. The digital filter determines the accumulated gain using a predetermined stage number and a predetermined decimator factor.

22 Claims, 5 Drawing Sheets

(51) Int. Cl.
    *H03K 21/10*     (2006.01)
    *G01R 23/10*     (2006.01)
    *H03H 17/06*     (2006.01)

(56) References Cited

FOREIGN PATENT DOCUMENTS

| | | |
|---|---|---|
| KR | 10-2005-0035233 A | 4/2005 |
| KR | 10-2008-0059176 A | 6/2008 |
| KR | 10-2013-0060756 A | 6/2013 |
| WO | WO 2007/027690 A2 | 3/2007 |

OTHER PUBLICATIONS

Korean Office Action dated Sep. 17, 2018 in corresponding Korean Patent Application No. 10-2016-0175036 (13 pages in English, 10 pages in Korean).
Korean Office Action dated Mar. 27, 2019 in corresponding Korean Patent Application No. 10-2016-0175036 (12 pages in English, 9 pages in Korean).

\* cited by examiner

DIGITAL FREQUENCY MEASURING APPARATUS

CROSS-REFERENCE TO RELATED APPLICATION

This application claims the benefit under 35 USC 119(a) of Korean Patent Application Nos. 10-2016-0141902 filed on Oct. 28, 2016 and 10-2016-0175036 filed on Dec. 20, 2016 in the Korean Intellectual Property Office, the entire disclosure of which is incorporated herein by reference for all purposes.

BACKGROUND

1. Field

The following description relates to a digital frequency measuring apparatus.

2. Description of Related Art

Various frequency measuring methods are commonly used in the related art, but there may be difficulties in simultaneously providing relatively high frequency resolution as well as a relatively high sampling rate.

In detail, in terms of relatively high frequency resolution in measuring frequencies, precise control and discrimination are possible. When measuring impedance (magnitude and phase) between nodes, using a relatively high frequency resolution results in a more accurate measurement. When measuring frequency, using a relatively high sampling rate that's at least twice as fast as the highest frequency to be measured, ensures a relatively fast and accurate control.

However, as sampling rate increases, frequency resolution degrades. On the other hand, when frequency resolution is increased, the time it takes to measure the frequency increases, thereby degrading the sampling rate. The relationship of frequency resolution to sampling rate is one of the factors considered when developing frequency measuring apparatuses. As an example, frequency resolution is a value obtained by dividing the frequency of the clock signal by the sampling rate. That is, [frequency resolution=(frequency of clock signal)/(sampling rate)]. As another example, when considering the predetermined division value N, the frequency resolution is a value obtained by dividing the value (from the frequency of the clock signal times the predetermined division value N) by the sampling rate. That is, [frequency resolution=((frequency of the clock signal)*N)/(sampling rate)].

Conventional digital frequency measuring techniques measure frequency using various methods, such as an integrator using a counter. Frequency counters usually measure the number of oscillations or pulses per second in a periodic electronic signal.

The frequency measuring techniques typically use an internal oscillator having a relatively high frequency when the input frequency to be measured has a wide frequency band. However, using an oscillator with a high frequency in order to increase the resolution of the measured input frequency, decreases the sampling rate.

In conventional arts, frequency measuring techniques that use a counter is commonly used as a frequency counting method where an input frequency is measured by counting clock cycles internally-provided by a main oscillator.

In conventional frequency measuring techniques, when an input frequency is similar to or greater than that of a main oscillator, discrimination of frequencies becomes difficult.

For example, when input frequencies of 10 MHz and 9.8 MHz are counted using clock cycles of a 20 MHz main oscillator, the counter values for both cases are 2 clock cycles, making 10 MHz indistinguishable from 9.8 MHz.

As described above, in a case in which frequency measuring methods of the related art are used, satisfying both frequency resolution and sampling rate in a trade-off relationship may be problematic.

Thus, a structure for satisfying a relatively wide frequency input range is required to improve both the frequency resolution and the sampling rate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a digital frequency measuring apparatus includes a frequency divider configured to divide an input frequency signal and provide a divided frequency signal; a period counter configured to count clock cycles in a period of the divided frequency signal using a clock signal and provide a period count value for each period; and a digital filter configured to amplify the period count value using an accumulated gain and provide an amplified period count value as a first digital output value, wherein the digital filter determines the accumulated gain using a predetermined stage number and a predetermined decimator factor.

The digital filter may determine the accumulated gain using the exponential of the predetermined stage number as an exponent with the predetermined decimator factor as a base.

The digital filter may include a decimator cascade integrator comb (CIC) filter amplifying the period count value from the period counter using the accumulated gain and convert the amplified period count value into a frequency to be provided as the first digital output value.

The decimator CIC filter may include an integrating circuit configured to include a plurality of integrators cascaded in a number equal to the predetermined stage number and sequentially accumulate the period count value from the period counter to provide an accumulation value for each period; a decimator is configured to sample the accumulation value for each period from the integrating circuit one at a time in each period corresponding to the predetermined decimator factor and provide a downsampled accumulation value; and a comb circuit is configured to comprise a plurality of combs cascaded in a number equal to the predetermined stage number and subtract a previous downsampled accumulation value from a current downsampled accumulation value from the decimator to provide a subtraction accumulation value for a period corresponding to the decimator factor.

The decimator CIC filter may be configured to amplify the period count value from the period counter using the accumulated gain determined by the predetermined stage number and the predetermined decimator factor and convert the amplified period count value into a frequency to provide a frequency value; and a moving average filter may be configured to calculate a moving average value of the amplified period count value from the decimator CIC filter and provide the moving average value of the amplified period count value as the first digital output value.

The decimator CIC filter may include an integrating circuit configured to include a plurality of integrators cascaded in a number equal to the predetermined stage number and sequentially accumulate the period count value from the period counter to provide an accumulation value for each period; a decimator may be configured to sample the accumulation value for each period from the integrating circuit one at a time in each period corresponding to the predetermined decimator factor and provide a downsampled accumulation value; and a comb circuit may be configured to subtract a previous downsampled accumulation value from a current downsampled accumulation value from the decimator and provide a subtraction accumulation value for a period corresponding to the predetermined decimator factor.

The moving average filter may include a 16 point moving average filter, and the 16 point moving average filter may calculate a moving average value of the frequency value from the decimator CIC filter based on 16 units and provides the moving average value of the amplified period count value as the first digital output value.

In another general aspect, a digital frequency measuring apparatus includes a frequency divider configured to divide an input frequency signal and provide a divided frequency signal; a period counter configured to count clock cycles in a period of the divided frequency signal using a clock signal and provide a period count value for each period; a digital filter configured to amplify the period count value using an accumulated gain and provide an amplified period count value as a first digital output value; and a frequency operator configured to convert the amplified period count value into an output frequency and provide the output frequency as a second digital output value, wherein the digital filter determines the accumulated gain using a predetermined stage number and a predetermined decimator factor.

The digital filter may determine the accumulated gain using the exponential of the predetermined stage number as an exponent with the predetermined decimator factor as a base.

The digital filter may include a decimator CIC filter amplifying the period count value of the period counter using the accumulated gain and converting the amplified period count value into a frequency to be provided as the first digital output value.

The decimator CIC filter may include an integrating circuit configured to include a plurality of integrators cascaded in a number equal to the predetermined stage number and sequentially accumulate the period count value from the period counter to provide an accumulation value for each period; a decimator may be configured to sample the accumulation value for each period from the integrating circuit in each period corresponding to the predetermined decimator factor and provide a downsampled accumulation value; and a comb circuit may be configured to comprise a plurality of combs cascaded in a number equal to the predetermined stage number and subtract a previous downsampled accumulation value from a current downsampled accumulation value from the decimator to provide a subtraction accumulation value for a period corresponding to the predetermined decimator factor.

The digital filter may further include a moving average filter. The decimator CIC filter may amplify the period count value from the period counter using the accumulated gain and convert the amplified period count value into a frequency to provide a frequency value. The moving average filter may calculate a moving average value of the amplified period count value from the decimator CIC filter and provide the moving average value of the amplified period count value as the first digital output value.

The moving average filter may include a 16 point moving average filter, and the 16 point moving average filter may calculate a moving average value of the frequency value from the decimator CIC filter based on 16 units and provide the moving average value of the amplified period count value as the first digital output value.

The frequency operator may convert the amplified period count value into an output frequency according to the following Equation, $$Fout = (Fclk * TSN(=N*GAIN))/(APCV+GAIN)$$

where Fout is an output frequency, Fclk is a clock frequency of a clock signal of the period counter, TSN is a total sample number determined by multiplying a division value N by GAIN, GAIN is an accumulated gain of the digital filter, and APCV is an amplified period count value determined by multiplying a period count value PCV and GAIN.

In another general aspect, a digital frequency measuring apparatus includes a processor configured to divide an input frequency signal to be measured by N to create a divided frequency signal, where N is an integer; count clock cycles in a period of the divided frequency signal using a clock signal to create a period count value for each period; and amplify the period count value as a first digital output value using an accumulated gain of a digital filter to create an amplified period count value, wherein the digital filter determines the accumulated gain using a predetermined stage number and a predetermined decimator factor.

The digital frequency measuring apparatus may further include a memory configured to store instructions; wherein the processor is further configured to execute the instructions to configure the processor to divide the input frequency signal to be measured by N to create the divided frequency signal, where N is an integer; count clock cycles in the period of the divided frequency signal using the clock signal to create the period count value for each period; and amplify the period count value as the first digital output value using the accumulated gain of the digital filter to create the amplified period count value.

The processor may include a frequency divider configured to divide the input frequency signal to be measured by N to create the divided frequency signal, where N is an integer; a period counter configured to count clock cycles in the period of the divided frequency signal using the clock signal to create the period count value for each period; and a digital filter configured to amplify the period count value as the first digital output value using the accumulated gain of the digital filter to create an amplified period count value.

The digital filter may determine the accumulated gain using the exponential of the predetermined stage number as an exponent with the predetermined decimator factor as a base.

The digital filter may include a decimator cascade integrator comb (CIC) filter amplifying the period count value from the period counter using the accumulated gain and converting the amplified period count value into a frequency to be provided as the first digital output value.

The frequency divider may be a fractional-N divider using a divide-by-N and a divide-by-(N+1) frequency divider.

A camera module may include the digital frequency measuring apparatus.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Subsequently, examples are described in further detail with reference to the accompanying drawings.

Figure 1:
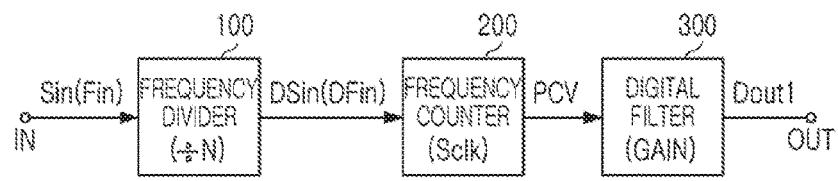
FIG. 1 is an example of a digital frequency measuring apparatus.
Figure 2:
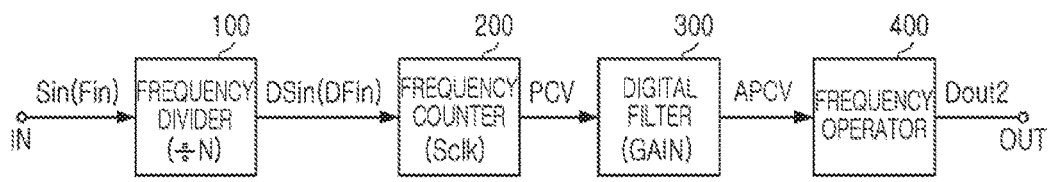
FIG. 2 is an example of a digital frequency measuring apparatus.

FIGS. 1 and 2 are examples of a digital frequency measuring apparatus.

With reference to FIG. 1, a digital frequency measuring apparatus includes a frequency divider 100, a period counter 200, and a digital filter 300.

With reference to FIG. 2, a digital frequency measuring apparatus includes a frequency divider 100, a period counter 200, a digital filter 300, and a frequency operator 400.

In FIGS. 1 and 2, the frequency divider 100 divides an analog input signal Sin having a frequency Fin using a predetermined division value N, where N represents a natural number. The frequency divider 100 decreases the input frequency in multiple bands of frequencies (e.g., ten 10 MHz bands if the input frequency is 100 MHz and N is 10), and provide the period counter 200 with the divided signal (DSin=Sin/N). As an example, referring to the equation of [frequency resolution=((frequency of clock signal)*N)/(sampling rate)], the predetermined division value N may be determined in consideration of the input signals Sin(Fin), Sclk(Fclk), and frequency resolution.

The frequency divider 100 may be implemented as a divide-by-N frequency divider or as a fractional-N divider using a divide-by-N and a divide-by-(N+1) frequency divider constructed of flip-flops, shift registers or an IC chip to obtain a determined ratio.

In this example, the frequency divider 100 is configured to select a division value N, in order to obtain a desired frequency resolution. Frequency resolution of the frequency divider 100 is calculated by multiplying the clock frequency Fclk of a clock signal Sclk by a total sample number (TSN)(Fclk*TSN). Thus, the frequency resolution is improved as the clock frequency Fclk of the clock signal Sclk is relatively higher or the TSN is increased.

The clock frequency Fclk may be 50 MHz, for example, while the TSN may be determined by multiplying the division value N by an accumulated gain GAIN of the digital filter 300. For example, if the division value N is 100, and the accumulated gain GAIN of the digital filter 300 is 256, the TSN will be 25600.

In an example where the division value N is 100, and the frequency Fin of the analog input signal Sin is 100 MHz, the frequency (Fin/N) of the divided signal DSin will be 1 MHz.

The period counter 200 counts the period of clock cycles in the divided signal DSin from the frequency divider 100 using the clock signal Sclk, and provides the digital filter 300 with the period count value PCV per period of the divided signal DSin.

For example, in a case in which the clock frequency Fclk is 50 MHz, and a frequency DFin of the divided signal DSin is 1 MHz, the period count value PCV is counted from 0 to 49 (Fclk/DFin−1). In this case, the period counter 200 provides the period count value PCV in each period of the divided signal DSin(Fin/N) of the frequency divider 100.

The digital filter 300 amplifies the period count value PCV from the period counter 200 using a predetermined accumulated gain GAIN, and provides an amplified period count value APCV as a first digital output value Dout1. In this example, the digital filter 300 is formed using a digital filter, such as a cascade integrator comb (CIC).

The digital filter 300 may determine the accumulated gain GAIN using a predetermined stage number SN and a predetermined decimator factor R. For example, the digital filter 300 may determine the accumulated gain GAIN using the stage number SN as an exponent and the decimator factor R as a base. As an example, referring to the equation of [frequency resolution=(N*R^SN*Sclk(Fclk))/Sin(Fin)] and the equation of [sampling rate=Sin(Fin)/(N*R)], the stage number SN and the decimator number R can be determined in consideration of the frequency resolution, the input signals Sin(Fin), Sclk (Fclk), and the sampling rate.

Unnecessarily repeated descriptions of the same reference characters and components having the same functions may be omitted in respective examples of the present application.

With reference to FIG. 2, the frequency operator 400 converts the amplified period count value APCV from the digital filter 300 into an output frequency Fout, and provides the output frequency Fout as a second digital output value Dout2.

The amplified period count value APCV may be converted into the output frequency Fout according to Equation 1 described below.

$$Fout = (Fclk * TSN( = N * GAIN))/(APCV + GAIN)$$
$$= (Fclk * N * GAIN)/(PCV * GAIN + GAIN)$$
$$= (50 * 100 * 256)/(49 * 256 + 256)$$

= (50 * 100 * 256)/(12800) = 100

In Equation 1, Fclk refers to a clock frequency of the clock signal Sclk of the period counter 200; TSN refers to the total sample number determined by multiplying the division value N by the accumulated gain GAIN of the digital filter 300 (N*GAIN); GAIN refers to an accumulated gain of the digital filter 300; and APCV refers to an amplified period count value determined by multiplying the period count value PCV by the accumulated gain GAIN (PCV*GAIN).

The frequency divider 100, the period counter 200, the digital filter 300, and the frequency operator 400 may each be implemented by combining hardware, such as a microprocessor, or the like, and software embedded therein and programmed to perform a predetermined operation.

The hardware may include at least one processing unit and at least one memory. In this case, the processing unit may include at least one among a signal processor, a microprocessor, a central processing unit (CPU), an application specific integrated circuit (ASIC), and a field programmable gate arrays (FPGA).

The memory may include at least one between a volatile memory (such as random access memory (RAM)) and a nonvolatile memory (such as read only memory (ROM), or flash memory).

The digital frequency measuring apparatus according to an example provides an amplified period count value implemented as illustrated in FIG. 1 as the first digital output value Dout1, or may provide an output frequency implemented as illustrated in FIG. 2 as the second digital output value Dout2, which is determined according to a value required in a device and an application applying the digital frequency measuring apparatus.

Figure 3:
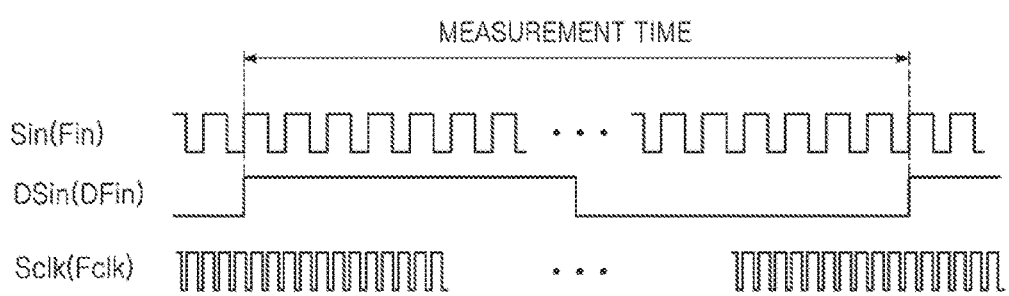
FIG. 3 is an example of an input frequency signal, a divided frequency signal, and a clock signal.

FIG. 3 is an example of a view of an input frequency signal, a divided frequency signal, and a clock signal.

In FIG. 3, Sin refers to an analog input signal input into a frequency divider 100 as a frequency measurement object, DSin refers to a signal divided in the period counter 200, and Sclk refers to a clock signal used in the period counter 200.

With reference to FIG. 3, in a case in which an input frequency Fin of an input signal Sin is 100 MHz, and a division value N is 100, a divided frequency DFin of the divided signal DSin is 1 MHz. A frequency Fclk of the clock signal Sclk may be 50 MHz, higher than the divided frequency DFin of the divided signal DSin.

Figure 4:
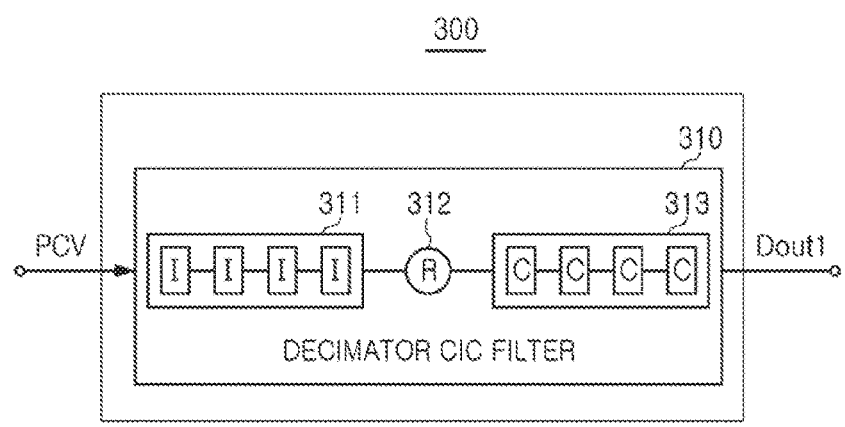
FIG. 4 is an example of a digital filter.
Figure 5:
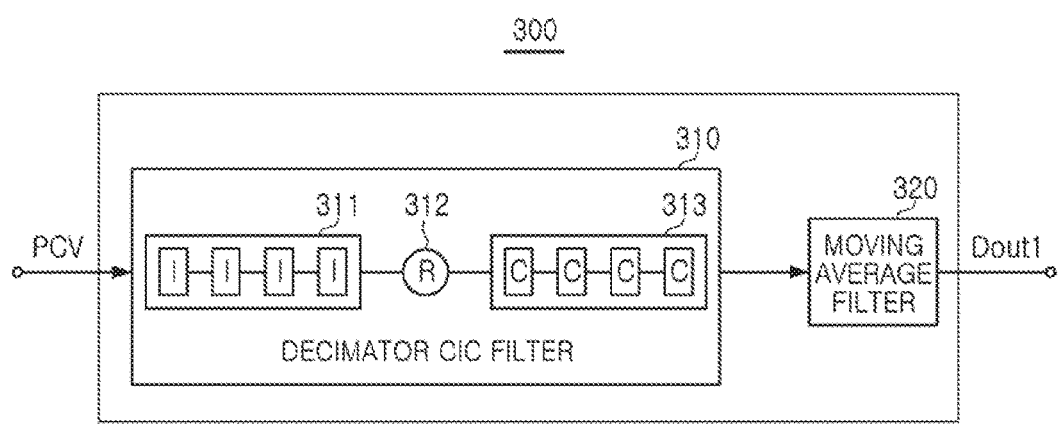
FIG. 5 is an example of a digital filter.

FIG. 4 is a view of a digital filter according to an example, while FIG. 5 is a view of a digital filter according to another example.

With reference to FIG. 4, a digital filter 300 includes a decimator CIC filter 310.

The decimator CIC filter 310 amplifies a period count value PCV from a period counter 200 using an accumulated gain determined based on a stage number SN and a decimator factor R, and converts an amplified period count value APCV into a frequency, thereby providing the amplified period count value APCV as a first digital output value Dout1.

With reference to FIG. 5, the digital filter 300 includes the decimator CIC filter 310 and a moving average filter 320.

The decimator CIC filter 310 amplifies the period count value PCV from the period counter 200 using the accumulated gain determined based on the stage number SN and the decimator factor R, and provides the amplified period count value APCV.

The moving average filter 320 calculates a moving average value of the amplified period count value APCV from the decimator CIC filter 310, and provides the moving average value of the amplified period count value APCV as the first digital output value Dout1.

In an example, the first digital output value Dout1 may be provided as the amplified period count value APCV or as the moving average value of the amplified period count value APCV.

With reference to FIGS. 4 and 5, the decimator CIC filter 310 includes an integrating circuit 311, a decimator 312, and a comb circuit 313.

The integrating circuit 311 includes a plurality of integrators I cascaded in a number equal to the stage number SN, and sequentially accumulates period count values PCV from the period counter 200, thereby providing an accumulation value per period.

The decimator 312 provides an accumulation value downsampled by sampling the accumulation value per period from the integrating circuit 311 one at a time in each period corresponding to the decimator factor R.

The comb circuit 313 includes a plurality of combs C cascaded in a number equal to the stage number SN, and subtracts a previous downsampled accumulation value from a current downsampled accumulation value from the decimator 312, thereby providing a subtraction accumulation value for a period corresponding to the decimator factor R.

For example, in a case in which the stage number SN is 4, and the decimator factor F is 4, the decimator CIC digital filter 310 is provided as a 4 stage 4 decimator CIC digital filter. Here, the accumulated gain GAIN may be provided as the fourth power of four ($4^4$=256). In this case, the stage number SN and the decimator factor R are provided as an example, and are not limited thereto.

In this case, the integrating circuit 311 includes four integrators I, and sequentially accumulates the period count value PCV from the period counter 200 along with a value delayed by four periods, thereby providing an accumulation value per period.

For example, in a case in which the integrating circuit 311 includes four integrators I, a first integrator inputs a count value Vcont in each period of the period counter 200, totals the count value Vcont and a previous accumulation value in each period, and accumulates the count value Vcount. A second integrator inputs a first accumulation value, totals the first accumulation value and a previous accumulation value, and accumulates the first accumulation value. In a manner the same as that of the case described above, a third and fourth integrator accumulate values by inputting an integrator output of a previous stage.

Since the decimator 312 samples the accumulation value per period from the integrating circuit 311 one at a time in every four periods corresponding to the decimator factor (R=4), an accumulation value downsampled by a fourth is provided.

The comb circuit 313 may include four combs C. In this case, a subtraction accumulation value accumulated during the latest fourth period may be provided in such manner that an accumulation value downsampled before a fourth period is subtracted from a current downsampled accumulation value from the decimator 312.

For example, in a case in which a stage number of the decimator CIC digital filter 310 is 4, the comb circuit 313 includes four cascaded combs C. In this case, a first comb subtracts an accumulation value Cin' downsampled before the fourth period from a current downsampled accumulation value Cin from the decimator 312. A second comb subtracts a result C1' of the first comb before the fourth period by inputting a result C1 of the first comb and transmits a result C2 to a third comb. In a manner the same as the case described above, the third comb and a fourth comb may subtract previous results Cin', C1', C2', C3', so that final output values, or a subtraction accumulation value APCV, is output as "Cin−Cin'−C1'−C2'−C3'".

In this case, Cin is a current accumulation value; Cin' is an accumulation value before the fourth period; C1' is a result of the previous first comb; C2' is the previous second comb; and C3' is the previous third comb. C3' is provided as "Cin−Cin'−C1'−C2'.

For example, as described in the digital filter 300, when the period count value PCV is 49, and the accumulated gain GAIN is 256, the amplified period count value APCV is 49*256 (=12544) by multiplying 49, the period count value PCV, by 256, the accumulated gain GAIN.

The digital filter 300 achieves the effect of obtaining a relatively large number of samples by amplifying the period count value PCV of a signal generated by dividing an input frequency signal using the accumulated gain GAIN, even when a relatively low division value is used.

Thus, the frequency division value for a desired frequency resolution is reduced to be 1/GAIN, compared to a counter method of the related art, by the accumulated gain GAIN of the digital filter 300, which amplifies an output rate of a count value per period of the period counter 200 by as much as the accumulated gain GAIN, and also increases the rate of sampling by as much as the accumulated gain GAIN.

With reference to FIG. 5, when the moving average filter 320 is provided as a 16 point moving average filter, a moving average value of the frequency value from the decimator CIC filter 310 is calculated based on 16 units, and a moving average value of the amplified period count value may be provided as the first digital output value Dout1.

For example, the 16 point moving average filter 320 calculates a moving sum of an output value of the 4 stage (stage number) and 4 factor decimator CIC digital filter 310 based on 16 pieces of data, and calculates an average thereof, thereby stabilizing fluctuations in a frequency measured value. In detail, a half-band digital filter, or the like, may be used as the moving average filter 320.

Resolution of a digital frequency measuring apparatus outputting the first digital output may be calculated by multiplying a clock frequency Fclk by the TSN. The first digital output may be converted into a frequency according to Equation 1, and may be provided as a second digital output.

Figure 6:
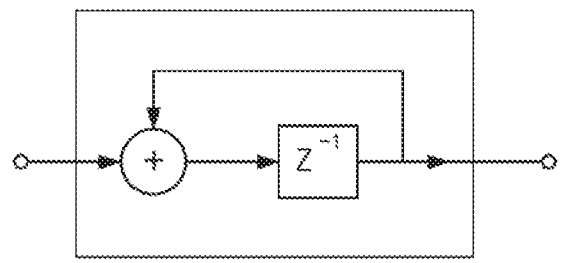
FIG. 6 is an example of an integrator I.

FIG. 6 is a view of an integrator I according to an example.

In FIGS. 4, 5, and 6, an integrating circuit 311 includes four integrators I.

The integrator I has a structure in which a period count value PCV that is currently input and a previous period count value PCV are integrated, and plays a role in amplifying the period count value PCV by accumulating the period count value PCV. In this case, the integrator I has a biquadrate effect using the number of a stage having four cascaded structures.

Figure 7:
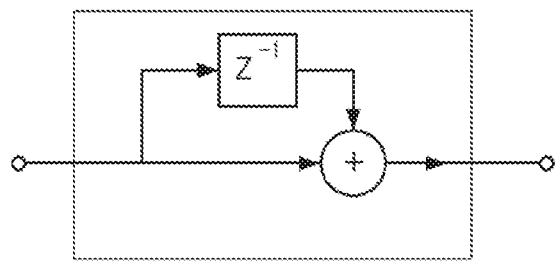
FIG. 7 is an example of a comb C.

FIG. 7 is a view of a comb C according to an example.

In FIGS. 4, 5, and 7, a comb circuit 313 includes four combs C.

The comb C provides a subtraction accumulation value for a fourth period corresponding to a decimator factor R by subtracting a previous downsampled accumulation value from a current downsampled accumulation value from a decimator 312 that is currently input. Thus, an unlimitedly accumulated value may be prevented from being provided.

In detail, the comb C plays a role in subtracting an accumulation value before the fourth period from an accumulation value that is currently input, so that an integrated value may have an accumulation value during the four periods.

In a digital filter 300, in a case in which a differential delay number M is 1, an accumulated gain GAIN may be 256 by (RM)^SN (R: a decimator factor, M: a differential delay number, and SN=a stage number). Thus, the digital filter 300 has an amplification effect of 256 times.

Figure 8:
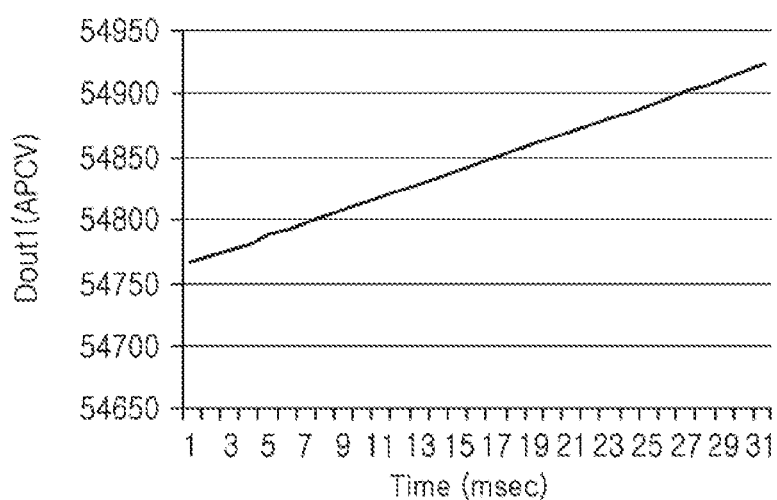
FIG. 8 is a graph illustrating an example of a digital output value.
Figure 9:
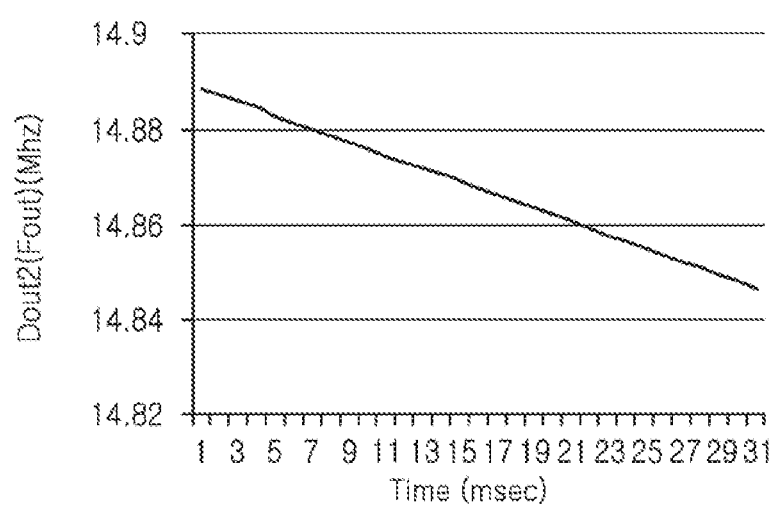
FIG. 9 is a graph illustrating an example of a frequency measurement value of the digital output value of FIG. 8.

FIG. 8 is a graph illustrating an example of a digital output value, while FIG. 9 is a graph illustrating a frequency measurement value of the digital output value of FIG. 8.

In the graph illustrated in FIG. 8, the Y axis refers to a first digital output value Dout1, or an amplified period count value, while an X axis refers to time. The graph illustrates an example of a measurement result of the first digital output value Dout1 in response to a frequency change of an input frequency signal (14.888 MHz to 14.846 MHz).

In FIG. 8, as a frequency of the input signal is reduced from 14.888 MHz to 14.846 MHz, the first digital output value Dout1, or an amplified period count value APCV is increased.

In the graph illustrated in FIG. 9, the Y axis refers to a second digital output value Dout2, or a measurement frequency value, while an X axis refers to time. The graph illustrates an example of a result of converting the first digital output value Dout1 illustrated in FIG. 8 into a frequency.

In FIG. 9, it is confirmed that as a frequency of the input signal is reduced from 14.888 MHz to 14.846 MHz, the second digital output value Dout2, or a measurement frequency value is increased.

With reference to FIGS. 8 and 9, according to a digital frequency measuring apparatus according to an example, it is confirmed that a frequency gradually reduced from 14.888 MHz to 14.846 MHz can accurately counted.

With reference to FIGS. 1 to 10, a method of measuring a digital frequency is described below. In the present application, descriptions of the digital frequency measuring apparatus and the method of measuring a digital frequency may complement and be applied to each other, except when specific explanation is provided.

Figure 10:
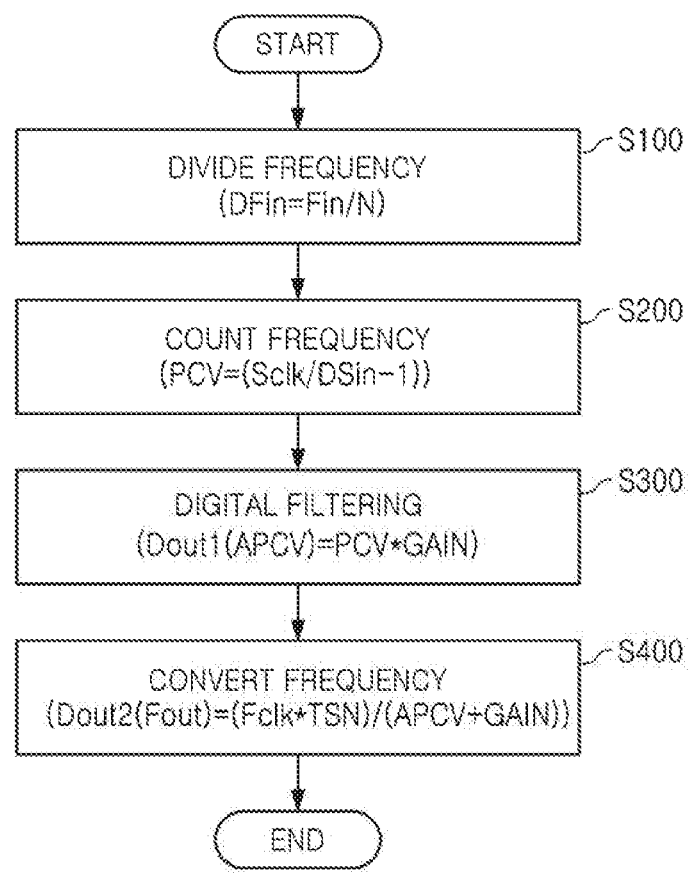
FIG. 10 is a view of an example of a method of measuring a digital frequency.

FIG. 10 is a view of an example of a method of measuring a digital frequency. The method of measuring a digital frequency according to an example may be described with reference to FIG. 10.

An input signal Sin is divided by a frequency divider 100, and a divided signal Dsin is provided, in S100.

The period of the divided signal DSin from the frequency divider 100 is counted using a clock signal Sclk by a period counter 200, and a period count value PCV per period is provided, in S200.

The period count value PCV is amplified using an accumulated gain GAIN by a digital filter 300, and an amplified period count value is provided as a first digital output value Dout1, in S300.

In addition, the amplified period count value is converted into a frequency according to Equation 1 by a frequency operator 400, and a second digital output value Dout2 is provided, in S400.

As set forth above, according to examples, the digital frequency measuring apparatus can be applied to a sensor device that demands ultra-high precision frequency resolution, maintaining high precision, and having a high sampling rate when the input frequency signal to be measured gradually changes. The disclosed digital frequency measuring apparatus can also be applied to a position detecting sensor so as to improve precision and a rate of control, and to have noise characteristics further reduced than available in an analog mode by applying a digital mode.

The frequency divider 100, the period counter 200, the digital filter 300, and the frequency operator 400 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A digital frequency measuring apparatus, comprising:
    a frequency divider configured to divide an input frequency signal and provide a divided frequency signal;
    a period counter configured to count clock cycles in a period of the divided frequency signal using a clock signal and provide a period count value for each period; and
    a digital filter configured to amplify the period count value using an accumulated gain and provide an amplified period count value as a first digital output value,
    wherein the digital filter determines the accumulated gain using a predetermined stage number and a predetermined decimator factor.

2. The digital frequency measuring apparatus of claim 1, wherein the digital filter determines the accumulated gain using the exponential of the predetermined stage number as an exponent with the predetermined decimator factor as a base.

3. The digital frequency measuring apparatus of claim 1, wherein the digital filter comprises a decimator cascade integrator comb (CIC) filter amplifying the period count value from the period counter using the accumulated gain and converting the amplified period count value into a frequency to be provided as the first digital output value.

4. The digital frequency measuring apparatus of claim 3, wherein:
    the decimator CIC filter comprises an integrating circuit configured to comprise a plurality of integrators cascaded in a number equal to the predetermined stage number and sequentially accumulate the period count value from the period counter to provide an accumulation value for each period;
    a decimator is configured to sample the accumulation value for each period from the integrating circuit one at a time in each period corresponding to the predetermined decimator factor and provide a downsampled accumulation value; and
    a comb circuit is configured to comprise a plurality of combs cascaded in a number equal to the predetermined stage number and subtract a previous downsampled accumulation value from a current downsampled accumulation value from the decimator to provide a subtraction accumulation value for a period corresponding to the decimator factor.

5. The digital frequency measuring apparatus of claim 1, wherein:
    the digital filter comprises the decimator CIC filter configured to amplify the period count value from the period counter using the accumulated gain determined by the predetermined stage number and the predetermined decimator factor and convert the amplified period count value into a frequency to provide a frequency value; and
    a moving average filter is configured to calculate a moving average value of the amplified period count value from the decimator CIC filter and provide the moving average value of the amplified period count value as the first digital output value.

6. The digital frequency measuring apparatus of claim 5, wherein:
    the decimator CIC filter comprises an integrating circuit configured to include a plurality of integrators cascaded in a number equal to the predetermined stage number and sequentially accumulate the period count value from the period counter to provide an accumulation value for each period;
    a decimator is configured to sample the accumulation value for each period from the integrating circuit one at a time in each period corresponding to the predetermined decimator factor and provide a downsampled accumulation value; and
    a comb circuit is configured to subtract a previous downsampled accumulation value from a current downsampled accumulation value from the decimator and provide a subtraction accumulation value for a period corresponding to the predetermined decimator factor.

7. The digital frequency measuring apparatus of claim 5, wherein the moving average filter comprises a 16 point moving average filter, and the 16 point moving average filter calculates a moving average value of the frequency value from the decimator CIC filter based on 16 units and provides the moving average value of the amplified period count value as the first digital output value.

8. A digital frequency measuring apparatus, comprising:
    a frequency divider configured to divide an input frequency signal and provide a divided frequency signal;
    a period counter configured to count clock cycles in a period of the divided frequency signal using a clock signal and provide a period count value for each period;
    a digital filter configured to amplify the period count value using an accumulated gain and provide an amplified period count value as a first digital output value; and
    a frequency operator configured to convert the amplified period count value into an output frequency and provide the output frequency as a second digital output value,
    wherein the digital filter determines the accumulated gain using a predetermined stage number and a predetermined decimator factor.

9. The digital frequency measuring apparatus of claim 8, wherein the digital filter determines the accumulated gain using the exponential of the predetermined stage number as an exponent with the predetermined decimator factor as a base.

10. The digital frequency measuring apparatus of claim 8, wherein the digital filter comprises a decimator CIC filter amplifying the period count value of the period counter using the accumulated gain and converting the amplified period count value into a frequency to be provided as the first digital output value.

11. The digital frequency measuring apparatus of claim 10, wherein:
    the decimator CIC filter comprises an integrating circuit configured to comprise a plurality of integrators cascaded in a number equal to the predetermined stage number and sequentially accumulate the period count value from the period counter to provide an accumulation value for each period;
    a decimator is configured to sample the accumulation value for each period from the integrating circuit in each period corresponding to the predetermined decimator factor and provide a downsampled accumulation value; and a comb circuit is configured to comprise a plurality of combs cascaded in a number equal to the predetermined stage number and subtract a previous downsampled accumulation value from a current downsampled accumulation value from the decimator to provide a subtraction accumulation value for a period corresponding to the predetermined decimator factor.

12. The digital frequency measuring apparatus of claim 8, wherein the digital filter further comprises a moving average filter, the decimator CIC filter amplifies the period count value from the period counter using the accumulated gain and converts the amplified period count value into a frequency to provide a frequency value, and the moving average filter calculates a moving average value of the amplified period count value from the decimator CIC filter and provides the moving average value of the amplified period count value as the first digital output value.

13. The digital frequency measuring apparatus of claim 12, wherein the moving average filter comprises a 16 point moving average filter, and the 16 point moving average filter calculates a moving average value of the frequency value from the decimator CIC filter based on 16 units and provides the moving average value of the amplified period count value as the first digital output value.

14. The digital frequency measuring apparatus of claim 8, wherein the frequency operator converts the amplified period count value into an output frequency according to the following Equation, $$F\text{out}=(F\text{clk}*TSN(N*GAIN))/(APCV+GAIN)$$

where Fout is an output frequency, Fclk is a clock frequency of a clock signal of the period counter, TSN is a total sample number determined by multiplying a division value N by GAIN, GAIN is an accumulated gain of the digital filter, and APCV is an amplified period count value determined by multiplying a period count value PCV and GAIN.

15. The digital frequency measuring apparatus of claim 8, wherein the frequency operator converts the amplified period count value into an output frequency as a function a clock frequency of a clock signal of the period counter, a total sample number, an accumulated gain of the digital filter, and an amplified period count value.

16. A digital frequency measuring apparatus, comprising:
a processor configured to:
divide an input frequency signal to be measured by N to create a divided frequency signal, where N is an integer;
count clock cycles in a period of the divided frequency signal using a clock signal to create a period count value for each period; and
amplify the period count value as a first digital output value using an accumulated gain of a digital filter to create an amplified period count value,
wherein the digital filter determines the accumulated gain using a predetermined stage number and a predetermined decimator factor.

17. The digital frequency measuring apparatus of claim 16, further comprising a memory configured to store instructions;
wherein the processor is further configured to execute the instructions to configure the processor to divide the input frequency signal to be measured by N to create the divided frequency signal, where N is an integer;
count clock cycles in the period of the divided frequency signal using the clock signal to create the period count value for each period; and
amplify the period count value as the first digital output value using the accumulated gain of the digital filter to create the amplified period count value.

18. The digital frequency measuring apparatus of claim 16, wherein the processor comprises:
a frequency divider configured to divide the input frequency signal to be measured by N to create the divided frequency signal, where N is an integer;
a period counter configured to count clock cycles in the period of the divided frequency signal using the clock signal to create the period count value for each period; and
a digital filter configured to amplify the period count value as the first digital output value using the accumulated gain of the digital filter to create an amplified period count value.

19. The digital frequency measuring apparatus of claim 18, wherein the digital filter determines the accumulated gain using the exponential of the predetermined stage number as an exponent with the predetermined decimator factor as a base.

20. The digital frequency measuring apparatus of claim 18, wherein the digital filter comprises a decimator cascade integrator comb (CIC) filter amplifying the period count value from the period counter using the accumulated gain and converting the amplified period count value into a frequency to be provided as the first digital output value.

21. The digital frequency measuring apparatus of claim 18, wherein the frequency divider is a fractional-N divider using a divide-by-N and a divide-by-(N+1) frequency divider.

22. A camera module comprising the digital frequency measuring apparatus of claim 16.

* * * * *